US008816688B2

(12) United States Patent
Adachi et al.

(10) Patent No.: US 8,816,688 B2
(45) Date of Patent: Aug. 26, 2014

(54) MAGNETIC RESONANCE IMAGING APPARATUS AND MAGNETIC RESONANCE IMAGING METHOD

(75) Inventors: Kohei Adachi, Otawara (JP); Masatoshi Hanawa, Otawara (JP); Kazuya Okamoto, Saitama (JP)

(73) Assignees: Kabushiki Kaisha Toshiba, Minato-Ku (JP); Toshiba Medical Systems Corporation, Otawara-Shi (JP)

( * ) Notice: Subject to any disclaimer, the term of this patent is extended or adjusted under 35 U.S.C. 154(b) by 174 days.

(21) Appl. No.: 13/214,348

(22) Filed: Aug. 22, 2011

(65) Prior Publication Data
US 2011/0298459 A1 Dec. 8, 2011

Related U.S. Application Data

(63) Continuation of application No. 12/492,700, filed on Jun. 26, 2009, now Pat. No. 8,111,070.

(30) Foreign Application Priority Data

Jun. 26, 2008 (JP) .................. 2008-167784
Apr. 24, 2009 (JP) .................. 2009-106627

(51) Int. Cl.
*G01V 3/00* (2006.01)
(52) U.S. Cl.
USPC .................. 324/320; 324/318
(58) Field of Classification Search
USPC .................. 324/320, 318, 307, 309
See application file for complete search history.

(56) References Cited

U.S. PATENT DOCUMENTS

| 5,818,229 | A | 10/1998 | Kanazawa | |
|---|---|---|---|---|
| 7,218,113 | B2 * | 5/2007 | Feiweier et al. | 324/320 |
| 7,535,230 | B2 | 5/2009 | Takagi | |
| 7,560,924 | B2 | 7/2009 | Kanda | |
| 7,633,293 | B2 * | 12/2009 | Olson et al. | 324/318 |
| 7,847,554 | B2 | 12/2010 | Nistler et al. | |
| 7,902,821 | B2 | 3/2011 | Nistler | |
| 2008/0231273 | A1 | 9/2008 | Kabasawa | |

FOREIGN PATENT DOCUMENTS

| JP | 06-285036 | 10/1994 |
|---|---|---|
| JP | 2000-126150 | 5/2000 |
| JP | 2003-190118 | 7/2003 |
| JP | 2006-508759 | 3/2006 |
| JP | 2008-067830 | 3/2008 |
| JP | 2008-514259 | 5/2008 |
| WO | 2004/053514 A1 | 6/2004 |
| WO | 2006/033047 A2 | 3/2006 |
| WO | 2007/042951 A1 | 4/2007 |

OTHER PUBLICATIONS

JP Office Action dated Sep. 10, 2013 in JP 2009-106627.
JP Office Action dated Jun. 3, 2014 in JP 2013-230274.

* cited by examiner

*Primary Examiner* — Louis Arana
(74) *Attorney, Agent, or Firm* — Nixon & Vanderhye, P.C.

(57) ABSTRACT

A magnetic resonance imaging apparatus includes an imaging condition acquisition unit and an imaging unit. The imaging condition acquisition unit acquires at least one of optimum amplitude and optimum phase of a radio frequency transmission signal so as to reduce a deviation of data in at least one region of interest set in an object. The imaging unit acquires image data by imaging according to an imaging condition including at least one of optimum amplitude and optimum phase.

10 Claims, 8 Drawing Sheets

MAGNETIC RESONANCE IMAGING APPARATUS AND MAGNETIC RESONANCE IMAGING METHOD

CROSS-REFERENCE TO RELATED APPLICATIONS

This application is a continuation of co-pending Ser. No. 12/492,700 filed Jun. 26, 2009, which claims priority based on Japanese Application Nos. 2008-167784 filed 26 Jun. 2008, and 2009-106627 filed 24 Apr. 2009, the entire contents of all of which are hereby incorporated by reference.

BACKGROUND OF THE INVENTION

1. Field of the Invention

The present invention relates to MRI (magnetic resonance imaging) apparatus and method which excite nuclear spins of an object magnetically with an RF (radio frequency) signal having a B1 magnetic field at the Larmor frequency and which reconstruct an image based on NMR (nuclear magnetic resonance) signals responsively generated due to the excitation and, more particularly, to MRI apparatus and method that make it possible to reduce influence of B1 inhomogeneity by universal B1 shimming without depending on characteristics of each object.

2. Description of Related Art

Magnetic Resonance Imaging (MRI) is an imaging method that excites nuclear spins of an object set in a static magnetic field with an RF magnetic signal B1 having the Larmor frequency and then reconstructs an image based on received NMR signals generated due to the excitation.

In recent years, B1 inhomogeneity has presented a problem that increases with higher static field MRI apparatus. B1 inhomogeneity is also called RF magnetic field inhomogeneity. B1 inhomogeneity is a phenomenon where the degree of heterogeneity is increased due to attenuation of a higher frequency excitation RF pulse with a shorter wavelength in a living body and where the RF echo-response signal may also become inhomogeneous in a higher magnetic field apparatus requiring a higher resonant frequency. That is, in a high magnetic field MRI apparatus, signal intensity distribution of an RF transmission pulse varies widely between a center and a peripheral part of an imaged area due to the influence of a difference in electric permittivity between imaged objects and the like.

Therefore, B1 shimming is required for reducing the influence of B1 inhomogeneity. That is, if a correction to equalize signal intensity distribution of an RF transmitted pulse is not performed, non-uniformity in sensitivity may be generated between the central part and the peripheral part of an imaged area. For that problem, research shows that transmitting the RF transmission pulse with a corrected amplitude and phase in an area to generate non-uniformity in sensitivity is effective for reducing the influence of B1 inhomogeneity (for example, refer to G. McKinnon et al., "RF Shimming With a Conventional 3T Body Coil," Proc. Intl. Soc. Mag. Reson. Med. 15 (2007), p. 173, D. Weyers et al., "Shading Reduction at 3.0T Using an Elliptical Drive," Proc. Intl. Soc. Mag. Reson. Med. 14 (2006), p. 2023 and J. Nistler et al., "Homogeneity Improvement Using A 2 Port Birdcage Coil," Proc. Intl. Soc. Mag. Reson. Med. 15 (2007), p. 1063).

However, an area where sensitivity non-uniformity is generated by an influence of B1 inhomogeneity and an appropriate phase and amplitude of an RF transmission pulse vary depending on each characteristic such as a weight, a height, a volume, a water distribution, a fat distribution and a muscle distribution of an object. To the contrary, B1 shimming proposed conventionally is the method to obtain the phase and the amplitude of the transmission RF pulse appropriate for the characteristics of a specific object in advance and to transmit the transmission RF pulse having the determined phase and amplitude to the area where the sensitivity non-uniformity is generated depending on the characteristics of the object. Therefore, appropriate B1 shimming cannot be performed constantly since the sensitivity non-uniformity area and an appropriate amplitude and a phase of RF transmission pulse also change when the object changes. In other words, when the conventional method is used as it is, the amplitude and the phase of the transmission RF pulse are adjusted regarding the common sensitivity non-uniformity area determined in advance though the sensitivity non-uniformity area varies depending on each object.

Further, it is necessary for a user to obtain an appropriate phase and amplitude of transmission RF pulse and to perform adjustments of the phase and the amplitude of the transmission RF pulse manually and frequently every time the object changes.

The problem mentioned above hinders implementation of B1 shimming function in a high magnetic field apparatus. For that reason, developing a technology for universal and simple B1 shimming coping with changing the object is desired.

SUMMARY

The present invention has been made in light of the conventional situations, and it is an object of the present invention to provide a magnetic resonance imaging apparatus and a magnetic resonance imaging method that make it possible to reduce influence of B1 inhomogeneity by use of more universal B1 shimming without depending so much on characteristics of each object.

The present exemplary embodiment provides a magnetic resonance imaging apparatus comprising: an imaging condition acquisition unit configured to acquire at least one of an amplitude and a phase of a radio frequency transmission signal so as to reduce a deviation of data in at least one region of interest set in an object; and an imaging unit configured to acquire image data by imaging according to an imaging condition including at least the one of the amplitude and the phase, in an aspect to achieve the object.

The present exemplary embodiment also provides a magnetic resonance imaging apparatus comprising: an imaging condition acquisition unit configured to acquire at least one of an amplitude and a phase of a radio frequency transmission signal so as to reduce a deviation of data in at least one region of interest set in an object based on a radio frequency magnetic field distribution corresponding to at least one of a body shape of the object and a coil used for transmitting the radio frequency transmission signal; and an imaging unit configured to acquire image data by imaging according to an imaging condition including at least the one of the amplitude and the phase, in an aspect to achieve the object.

The present exemplary embodiment also provides a magnetic resonance imaging method comprising: acquiring at least one of an amplitude and a phase of a radio frequency transmission signal so as to reduce a deviation of data in at least one region of interest set in an object; and acquiring image data by imaging according to an imaging condition including at least the one of the amplitude and the phase, in an aspect to achieve the object.

The present exemplary embodiment also provides a magnetic resonance imaging method comprising: acquiring at least one of an amplitude and a phase of a radio frequency transmission signal so as to reduce a deviation of data in at least one region of interest set in an object based on a radio frequency magnetic field distribution corresponding to at least one of a body shape of the object and a coil used for transmitting the radio frequency transmission signal; and acquiring image data by imaging according to an imaging condition including at least the one of the amplitude and the phase, in an aspect to achieve the object.

The magnetic resonance imaging apparatus and the magnetic resonance imaging method according to the present exemplary embodiment as described above make it possible to reduce influence of B1 inhomogeneity by more universal B1 shimming without depending so much on characteristics of each object.

DESCRIPTION OF THE PREFERRED EMBODIMENTS

A magnetic resonance imaging apparatus and a magnetic resonance imaging method according to embodiments of the present invention will be described with reference to the accompanying drawings.
(Configuration and Function)

Figure 1:
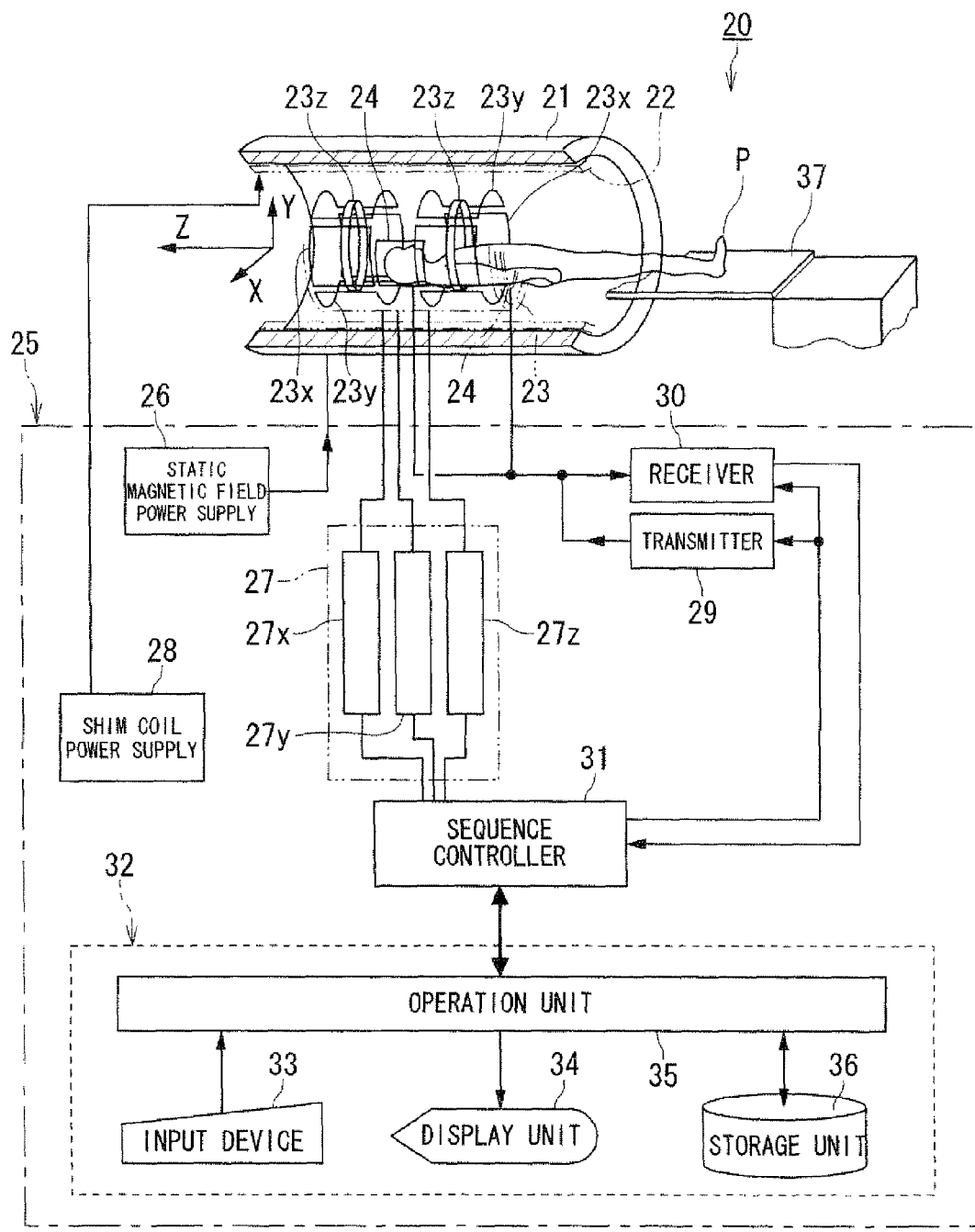
FIG. 1 is a block diagram showing a magnetic resonance imaging apparatus according to an embodiment of the present invention.

FIG. 1 is a block diagram showing a magnetic resonance imaging apparatus according to an embodiment of the present invention.

A magnetic resonance imaging apparatus 20 includes a static field magnet 21 for generating a static magnetic field, a shim coil 22 arranged inside the static field magnet 21 that is cylinder-shaped, a gradient coil 23 and RF coils 24.

The magnetic resonance imaging apparatus 20 also includes a control system 25. The control system 25 includes a static magnetic field power supply 26, a gradient power supply 27, a shim coil power supply 28, a transmitter 29, a receiver 30, a sequence controller 31 and a computer 32. The gradient power supply 27 of the control system 25 includes an X-axis gradient power supply 27x, a Y-axis gradient power supply 27y and a Z-axis gradient power supply 27z. The computer 32 includes an input device 33, a display unit 34, an operation unit 35 and a storage unit 36.

The static field magnet 21 communicates with the static magnetic field power supply 26. The static magnetic field power supply 26 supplies electric current to the static field magnet 21 to get the function to generate a static magnetic field in an imaging region. The static field magnet 21 includes a superconductivity coil in many cases. The static field magnet 21 gets current from the static magnetic field power supply 26 that communicates with the static field magnet 21 at excitation. However, once excitation has been made, the static field magnet 21 is usually isolated from the static magnetic field power supply 26. The static field magnet 21 may include a permanent magnet that makes the static magnetic field power supply 26 unnecessary.

The static field magnet 21 has the cylinder-shaped shim coil 22 coaxially inside itself. The shim coil 22 communicates with the shim coil power supply 28. The shim coil power supply 28 supplies current to the shim coil 22 so that the static magnetic field becomes uniform.

The gradient coil 23 includes an X-axis gradient coil 23x, a Y-axis gradient coil 23y and a Z-axis gradient coil 23z. Each of the X-axis gradient coil 23x, the Y-axis gradient coil 23y and the Z-axis gradient coil 23z that is cylinder-shaped is arranged inside the static field magnet 21. The gradient coil 23 has also a bed 37 in the area formed inside it that is an imaging area. The bed 37 supports an object P. The RF coils 24 include a whole body coil (WBC), which is built in the gantry, for transmission and reception of RF signals and local coils, which are arranged around the bed 37 or the object P, for reception of RF signals.

The gradient coil 23 communicates with the gradient power supply 27. The X-axis gradient coil 23x, the Y-axis gradient coil 23y and the Z-axis gradient coil 23z of the gradient coil 23 communicate with the X-axis gradient power supply 27x, the Y-axis gradient power supply 27y and the Z-axis gradient power supply 27z of the gradient power supply 27, respectively.

The X-axis gradient power supply 27x, the Y-axis gradient power supply 27y and the Z-axis gradient power supply 27z supply currents to the X-axis gradient coil 23x, the Y-axis gradient coil 23y and the Z-axis gradient coil 23z, respectively, so as to generate gradient magnetic fields Gx, Gy and Gz in the X, Y and Z directions in the imaging area.

The RF coils 24 communicate with the transmitter 29 and/or the receiver 30. The transmission RF coil 24 has a function to transmit an RF signal given from the transmitter 29 to the object P. The reception RF coil 24 has a function to receive an MR signal generated due to a nuclear spin inside the object P that is excited by the RF signal to give to the receiver 30.

The sequence controller 31 of the control system 25 communicates with the gradient power supply 27, the transmitter 29 and the receiver 30. The sequence controller 31 has a function to store sequence information describing control information needed in order to make the gradient power supply 27, the transmitter 29 and the receiver 30 drive and generate gradient magnetic fields Gx, Gy and Gz in the X, Y and Z directions and an RF signal by driving the gradient power supply 27, the transmitter 29 and the receiver 30 according to a predetermined sequence stored. The control information above-described includes motion control information, such as intensity, impression period and impression timing of the pulse electric current that should be impressed to the gradient power supply 27.

The sequence controller 31 is also configured to give raw data to the computer 32. The raw data is complex data obtained through the detection of an NMR signal and A/D conversion to the NMR signal detected in the receiver 30.

The transmitter 29 has a function to give an RF signal to the RF coil 24 in accordance with control information provided from the sequence controller 31. The receiver 30 has a function to generate raw data that is digitized complex number data by detecting an MR signal given from the RF coil 24 and performing predetermined signal processing and A/D conversion to the MR signal detected. The receiver 30 also has a function to give the generated raw data to the sequence controller 31.

Figure 2:
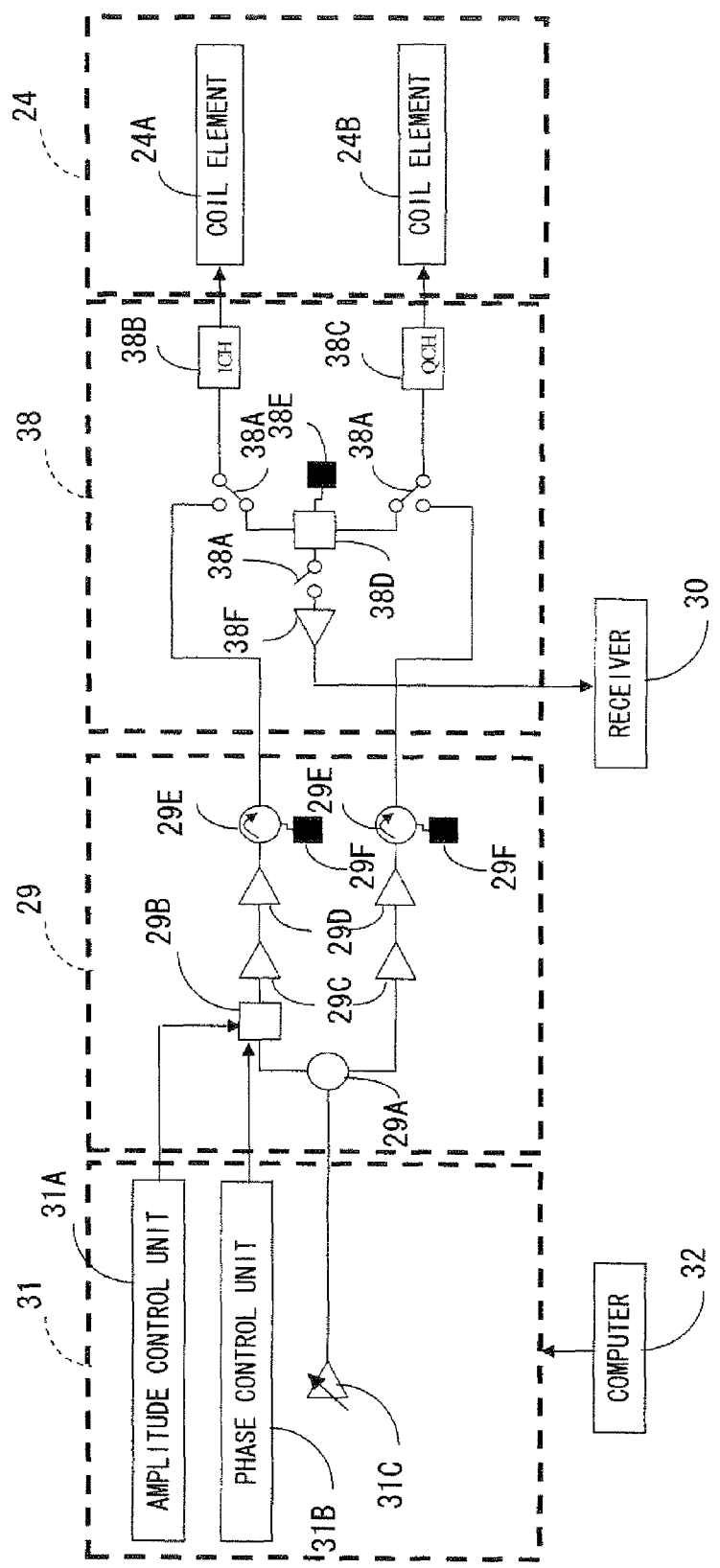
FIG. 2 is a diagram showing an example of detail configuration of the sequence controller, the transmitter and the RF coil shown in FIG. 1.

FIG. 2 is a diagram showing an example of detail configuration of the sequence controller 31, the transmitter 29 and the RF coil 24 shown in FIG. 1.

As shown in FIG. 2, the sequence controller 31 includes an amplitude control unit 31A, a phase control unit 31B and a signal generator 31C. The transmitter 29 includes a 90-degree signal distributor 29A, an amplitude-phase balancer 29B, a pair of transmission pre-amplifiers 29C, a pair of power amplifiers 29D, a pair of isolators 29E and a pair of 50Ω terminations 29F. The transmitter 29 performs as a parallel drive RF amplifier that makes two RF signals obtained by distributing a signal amplified in parallel. An RF front-end 38 is arranged between the transmitter 29 and the RF coil 24. The RF front-end 38 includes transmission/reception selector switches 38A, an I signal transmission/reception channel 38B, a Q signal transmission/reception channel 38C, a 90-degree phase compositor 38D, a 50Ω termination 38E and a reception pre-amplifier 38F. The RF coil 24 has plural coil elements including a coil element 24A for transmitting and receiving an I signal and a coil element 24B for transmitting and receiving a Q signal.

The amplitude control unit 31A, the phase control unit 31B and the signal generator 31C in the sequence controller 31 are configured to be controllable, respectively, by control signals from the computer 32. The amplitude control unit 31A has a function to adjust an amplitude of an I signal by providing a control signal to the amplitude-phase balancer 29B in the transmitter 29. The phase control unit 31B has a function to adjust a phase of an I signal by providing a control signal to the amplitude-phase balancer 29B in the transmitter 29. The signal generator 31C has a function to generate an RF signal and output the RF signal to the 90-degree signal distributer 29A in the transmitter 29.

The amplitude-phase balancer 29B and the transmission pre-amplifier 29C for the Q signal are connected in parallel to the 90-degree signal distributor 29A in the transmitter 29. The transmission pre-amplifier 29C for the I signal, the power amplifier 29D and the isolator 29E are connected in series subsequently to the amplitude-phase balancer 29B. The power amplifier 29D for the Q signal and the isolator 29E are connected in series subsequently to the transmission pre-amplifier 29C for the Q signal. The 50Ω terminations 29F are respectively connected to the respective isolators for the I signal and the Q signal.

The 90-degree signal distributor 29A has a function to distribute an RF signal obtained from the signal generator 31C to an I signal with the 0-degree phase and a Q signal with the 90-degree phase and to output the distributed Q signal to the corresponding transmission pre-amplifier 29C while outputting the distributed I signal to the amplitude-phase balancer 29B. The transmission pre-amplifier 29C has a function to set an amplitude and a phase of the I signal to predetermined values according to the control signals from the amplitude control unit 31A and the phase control unit 31B and to output the I signal after adjustment to the corresponding transmission pre-amplifier 29C. The respective transmission pre-amplifiers 29C and the respective power amplifiers 29D, respectively, have a function to amplify signals. The respective isolators 29E respectively have a function to insulate an input signal and an output signal serially for prevention of entering of a signal and protection of a circuit by the 50Ω terminations 29F.

The transmission/reception selector switches 38A in the RF front-end 38 have a function to switch between a circuit connection configuration for transmission of an RF signal and a circuit connection configuration for reception of an echo signal by switching the I signal transmission/reception channel 38B between the isolator 29E for the I signal side and the 90-degree phase compositor 38D side and the Q signal transmission/reception channel 38C between the isolator 29E for the Q signal side and the 90-degree phase compositor 38D side, respectively. The I signal transmission/reception channel 38B is configured to transmit an I signal and is connected to the coil element 24A to receive an echo signal corresponding to the I signal. The Q signal transmission/reception channel 38O is configured to transmit a Q signal and is connected to the coil element 24B to receive an echo signal corresponding to the Q signal. The 90-degree phase compositor 38D has a function to obtain a single echo signal by performing phase correction to cancel the 90-degree phase difference on echo signals respectively output from the I signal transmission/reception channel 38B and the Q signal transmission/reception channel 38C and combining the echo signals after the phase correction and to output the reception echo signal to the reception pre-amplifier 38F. The reception pre-amplifier 38F has a function to amplify the echo signal combined in the 90-degree phase compositor 38D and to output the amplified echo signal to the receiver 30.

The computer 32 gets various functions by the operation unit 35 executing some programs stored in the storage unit 36 of the computer 32. Alternatively, some specific circuits having various functions may be provided with the magnetic resonance imaging apparatus 20 instead of using some of the programs.

Figure 3:
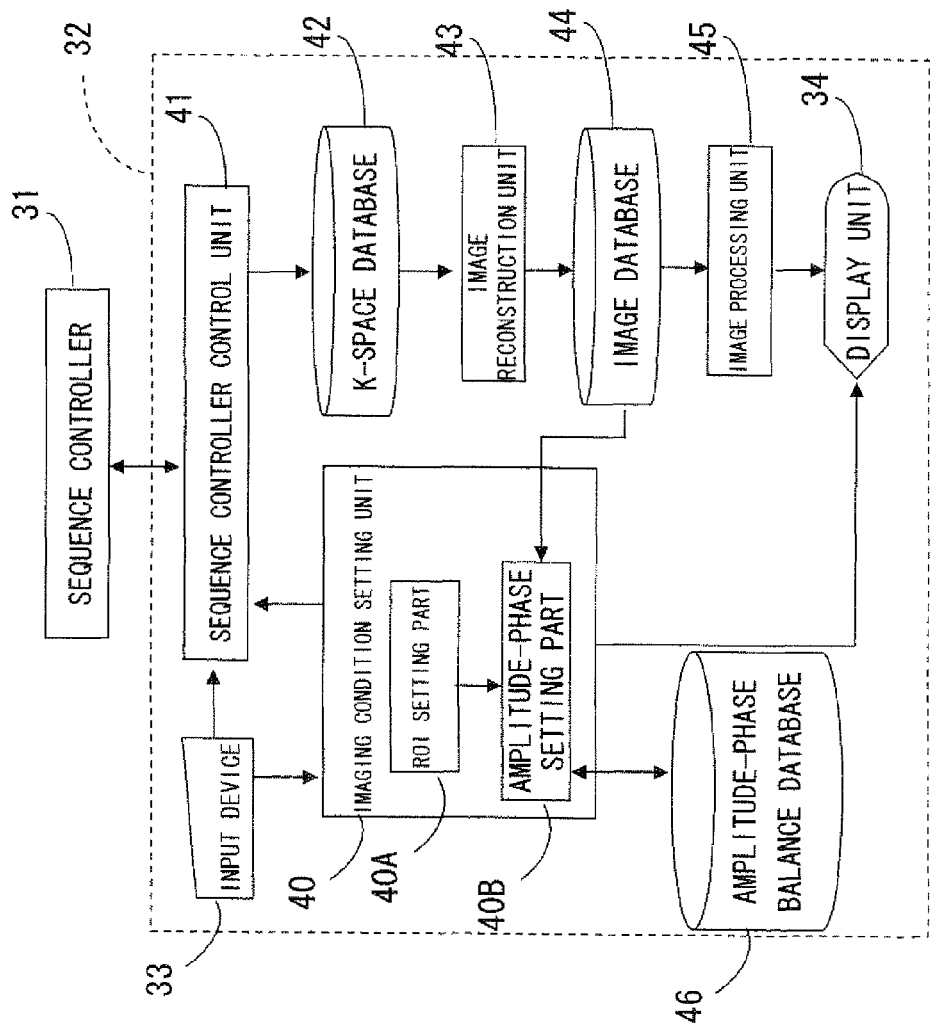
FIG. 3 is a functional block diagram of the computer shown in FIG. 1.

FIG. 3 is a functional block diagram of the computer 32 shown in FIG. 1.

The computer 32 functions as an imaging condition setting unit 40, a sequence controller control unit 41, a k-space database 42, an image reconstruction unit 43, an image database 44, an image processing unit 45 and an amplitude-phase balance database 46. The imaging condition setting unit 40 has an ROI setting part 40A and an amplitude-phase setting part 40B.

The imaging condition setting unit 40 has a function to set an imaging condition including a pulse sequence based on instruction from the input device 33 and to provide the set imaging condition to the sequence controller control unit 41. For that purpose, the imaging condition setting unit 40 has a function to display screen information for setting of an imaging condition on the display unit 34.

The ROI setting unit 40A in the imaging condition setting unit 40 has a function to set single or plural regions of interest (ROI). For that purpose, the ROI setting unit 40A is configured to refer to the image database 44 as needed.

The amplitude-phase setting unit 40B has a function to determine an absolute or relative value of either or both of a phase and an amplitude of an RF transmission signal for excitation of an object P so as to reduce a variation in signal intensity between pieces of data acquired from respective ROIs set in the ROI setting unit 40A and/or a variation in data in a single ROI. For that purpose, the amplitude-phase setting unit 40B is configured to refer to the image database 44. Thus, the amplitude-phase setting unit 40B is configured to set the determined phase and amplitude of the RF transmission signal as an imaging condition for an imaging scan.

Especially when the magnetic resonance imaging apparatus 20 is a high magnetic field apparatus, a signal intensity of an RF transmission signal changes every imaging part by an influence of so-called B1 inhomogeneity. That is, the signal intensity of the RF transmission signal becomes inhomogeneous spatially. The spatial inhomogeneity of the RF transmission signal also changes depending on characteristics including a weight, a height, a volume, a distribution of water, a distribution of fat, a distribution of muscle, a body shape and an age of an object. Therefore, a variation in intensity between acquired signals changes every ROI, every position in an ROI and every characteristic of an object by an influence of B1 inhomogeneity.

For that reason, the amplitude-phase setting unit 403 determines an appropriate (i.e., optimized) phase and/or amplitude of an RF transmission signal so as to reduce variation in signal intensity between pieces of data acquired in respective ROIs and/or variation in data in a single ROI in order to reduce an influence of B1 inhomogeneity. A single ROI or plural ROIs that become a target for reducing variation in signal intensity can be set manually based on instruction information from the input device 33 or automatically in the ROI setting unit 40A according to a predetermined condition. For example, an ROI setting mode for setting an ROI manually by user's operation of the input device 33 and an ROI setting mode in which an ROI is set automatically can be provided.

In the case of setting an ROI, it is necessary to determine a region for setting the ROI. The region for setting the ROI can be stored as a default value in the ROI setting unit 40A and can be also determined based on data acquired by a preparation scan for positioning to determine the region for setting the ROI automatically or manually.

Figure 4:
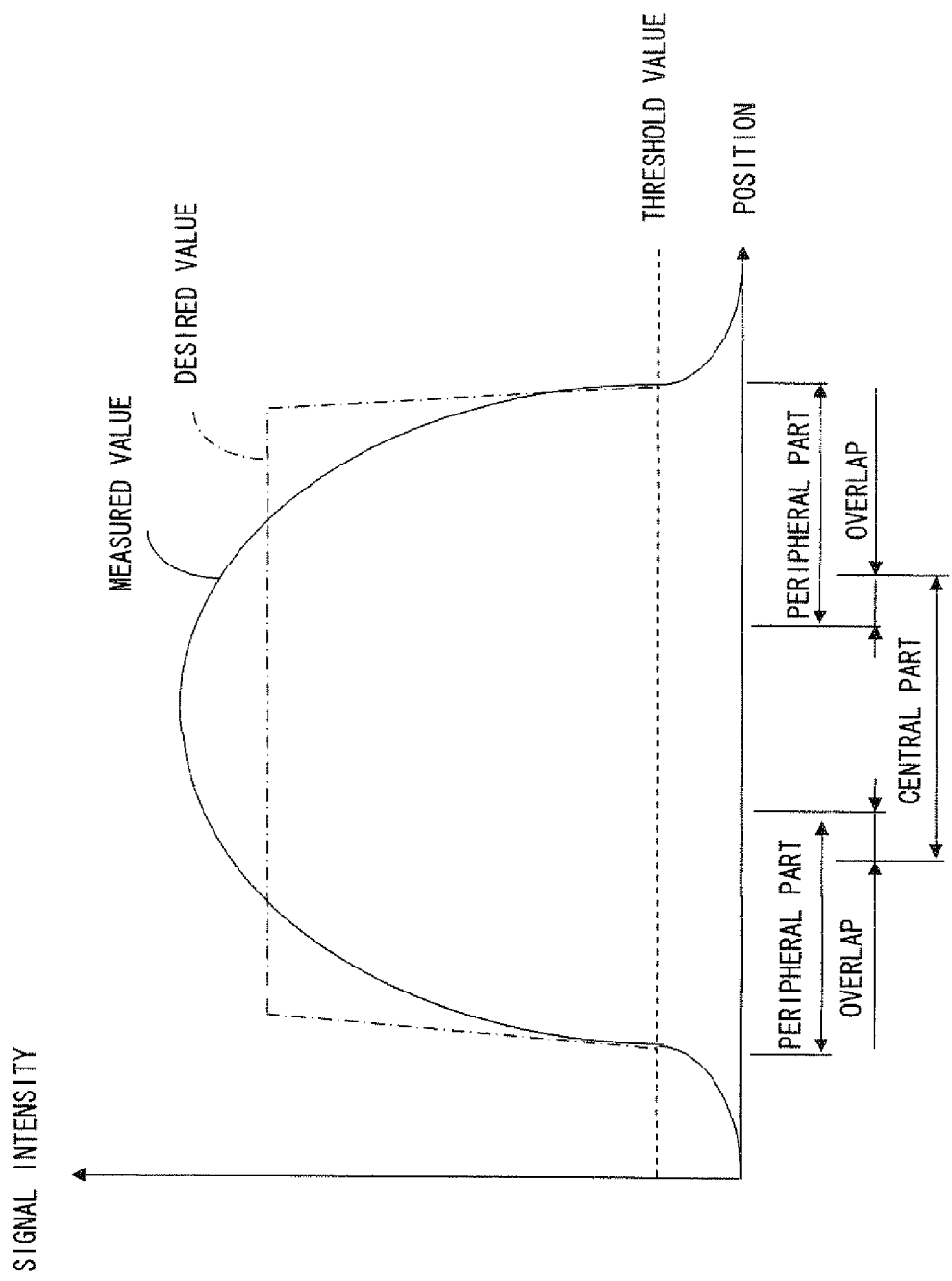
FIG. 4 is a graph for explaining a method of determining a region to set an ROI, based on data acquired by a preparation scan, in the ROI setting part shown in FIG. 3.

FIG. 4 is a graph for explaining a method of determining a region to set an ROI, based on data acquired by a preparation scan, in the ROI setting part 40A shown in FIG. 3.

In FIG. 4, the abscissa axis denotes a position in a certain one-dimensional direction and the ordinate axis denotes signal intensity of image data. For example, when a column-shaped human body equivalent phantom is imaged by a preparation scan, signal intensities of reconstructed image data on a section parallel to a central axis are shown in the solid line in FIG. 4. Note that setting to measure signal intensities of image data automatically in the ROI setting unit 40A leads to automation of processing and reduction of labor for user's operation. As shown in FIG. 4, while the signal intensities of the image data become large in the center part of the human body equivalent phantom, the signal intensities of the image data become small on the peripheral part of the human body equivalent phantom by the influence of B1 inhomogeneity.

On the other hand, ideal values of the signal intensities of the image data in the case of assuming that there is no influence of B1 inhomogeneity take a constant value within the range where the human body equivalent phantom exists as shown in the dot-dashed line in FIG. 4 and become zero outside the human body equivalent phantom. Therefore, it is necessary to determine an amplitude and a phase of an RF transmission pulse so that measured values of the image data shown by the solid line in FIG. 4 better approach the ideal values shown in the dot-dashed line.

The region for setting an ROI can be set with reference to the signal intensities of the image data in a range where the signal intensities are larger than or equal to a certain threshold value to be considered that the human body equivalent phantom exists. As described above, an existence region of an object P such as a human body equivalent phantom can be extracted as a region for setting an ROI. A user can set the region for setting an ROI manually by displaying a profile of the signal intensities of the image data as shown in FIG. 4 on the display unit 34 and specifying a range while operating the input device 33 such as a mouse. Alternatively, the region for setting an ROI can be set automatically based on magnitude relation between the threshold and each signal value of the data in the ROI setting unit 40A.

Note that the threshold can be defined as an absolute value of signal intensity. Alternatively, a low signal part to be considered as a background noise region can be extracted automatically from the image data and the threshold can be also defined as a relative value with respect to the low signal part.

An ROI can be also set manually or automatically. An overlap rate or an overlap amount between adjacent ROIs and a ratio of an area of an ROI to an area of the ROI setting region are listed in addition to the number, locations and shapes of ROIs as conditions for setting ROIs. If adjacent ROIs are made to overlap, continuous image data can be obtained by an imaging scan. Therefore, plural ROIs overlapped for a preparation scan can be set according to an ROI for an imaging scan. Parameters for setting ROIs can be stored as default values in the ROI setting unit 40A and can be changed by operation of the input device 33.

Figure 5:
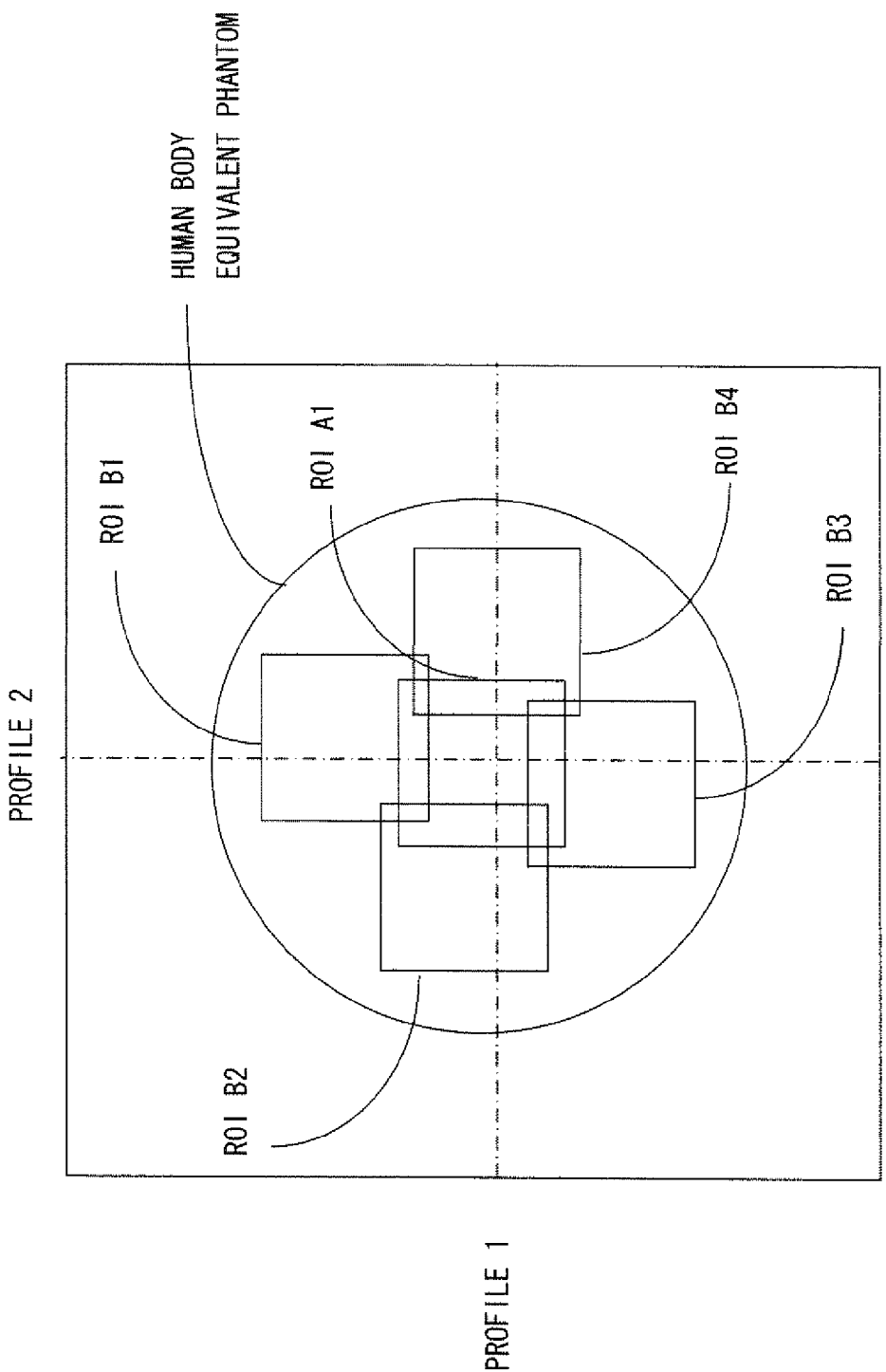
FIG. 5 is a view showing an example of plural ROIs set in the ROI setting part shown in FIG. 3.

FIG. 5 is a view showing an example of plural ROIs set in the ROI setting part 40A shown in FIG. 3.

As shown in FIG. 5, a contour of section of a human body equivalent phantom is extracted based on a profile of image data as a region for setting ROIs. For example, a desired-size of ROI A1 in the center and four desired-sizes of ROI B1, ROI B2, ROI B3 and ROI B4 on the periphery can be set with mutual overlapping at desired overlap rates. The information regarding the set plural ROIs is provided to the amplitude-phase setting unit 40B from the ROI setting unit 40A.

However, as shown in FIG. 4, a deviation exists in signal intensity between the central part and the peripheral part of the image data by an influence of B1 inhomogeneity. Consequently, a variation in signal intensity exists with regard to each ROI. A variation in signal intensity also exists within a single ROI. For that reason, the amplitude-phase setting unit 40B is configured to obtain an amplitude and a phase of an RF transmission signal so that a variation in signal intensity in a single ROI and/or among plural ROIs becomes minimum as an imaging condition for an imaging scan.

Methods for minimizing a variation in signal intensity in an ROI and between ROIs include a method for defining an index indicating a variation in signal intensity to obtain such an amplitude and a phase of an RF transmission signal that the defined index becomes minimum and set the obtained amplitude and phase as an imaging condition and a method for obtaining such an amplitude and a phase of an RF transmission signal that a more homogeneous B1 distribution can be obtained and set the obtained amplitude and phase as an imaging condition.

First, the method to obtain such an amplitude and a phase of an RF transmission signal that an index representing a variation in signal intensity becomes minimum will be described.

For example, as shown in FIG. 5, when the ROI A1 is set in the central part and ROIs of ROI B1, ROI B2, ROI B3, . . . , ROI Bi are set on the peripheral part, a deviation D in signal intensity of data between ROIs can be defined as equation (1):

$$D = I_{a1} - (I_{b1} + I_{b2} + I_{b3} + \ldots + I_{bi})/i \quad (1)$$

wherein Ia1 is a representative value of signal intensity for the ROI A1 and Ibk (1≤K≤i) is a representative value of signal intensity for each ROI Bk.

A representative value of signal intensity can be an average value, an intermediate value, a maximum value or a minimum value of signal intensities in each ROI. The representative value such as an average value and an intermediate value may be calculated while eliminating a singular value and/or an error value.

Specifically, as shown in equation (1), a difference between the representative value of signal intensities regarding the ROI A1 in the central part with relatively-high signal intensities and the average value of signal intensities regarding the ROI Bk on the peripheral part with relatively-low signal intensities can be defined as a deviation D in signal intensity of data among plural ROIs. Note that a deviation D in signal intensity of data among ROIs can be defined arbitrarily according to conditions such as the number and/or shapes of the ROIs or an imaging purpose without using equation (1). Similarly, a deviation in signal intensity of data in a single ROI can be also defined as equation (1) by setting plural regions and/or points in the ROI.

Note that the values measured automatically in the ROI setting unit 40A can be used as the signal intensities in each ROI. However, the signal intensities in each ROI can be also measured automatically in the amplitude-phase setting unit 40B.

When a deviation D in signal intensity of data among plural ROIs or in a single ROI is obtained as a value as mentioned above, such an amplitude and a phase of RF transmission signal that the deviation D becomes minimum can be calculated by an arbitrary search method. The representative methods for searching such an amplitude and a phase of RF transmission signal that the deviation D becomes minimum are a lattice search algorithm and a bisection method. Both lattice search algorithm and bisection method can be used as needed.

Lattice search algorithm is the method to obtain a deviation Ddata group in signal intensity among ROIs or in an ROI in case where a phase and an amplitude of RF transmission signal are changed two-dimensionally, i.e., a phase and an amplitude are set to parameters, and search such an amplitude and a phase of RF transmission signal that a deviation D becomes minimum based on the deviation Ddata group. Therefore, in the case of using a lattice search algorithm, a preparation scan is performed while respectively changing a phase and an amplitude of RF transmission signal. The imaging condition of the preparation scan while changing a phase and an amplitude of RF transmission signal respectively is set in the imaging condition setting unit 40. Changing the phase or the amplitude of RF transmission signal per slice section gradually at a predetermined interval as multi-slice imaging leads to shortening of an imaging time, considering a relaxation time and the like. In addition, sharing the preparation scan for acquiring data for extracting the contour of the object P described above and the preparation scan while respectively changing the phase and the amplitude of the RF transmission signal into a single scan also leads to shortening of the imaging time.

The amplitude and the phase of RF transmission signal set as an imaging condition in the imaging condition setting unit 40 are output to the amplitude control unit 31A and the phase control unit 31B in the sequence controller 31 through the sequence controller control unit 41, respectively. Thus, the amplitude and the phase of an I signal in an RF transmission signal can be adjusted to the set values respectively under the control of the amplitude-phase balancer 29B by the amplitude control unit 31A and the phase control unit 31B.

Figure 6:
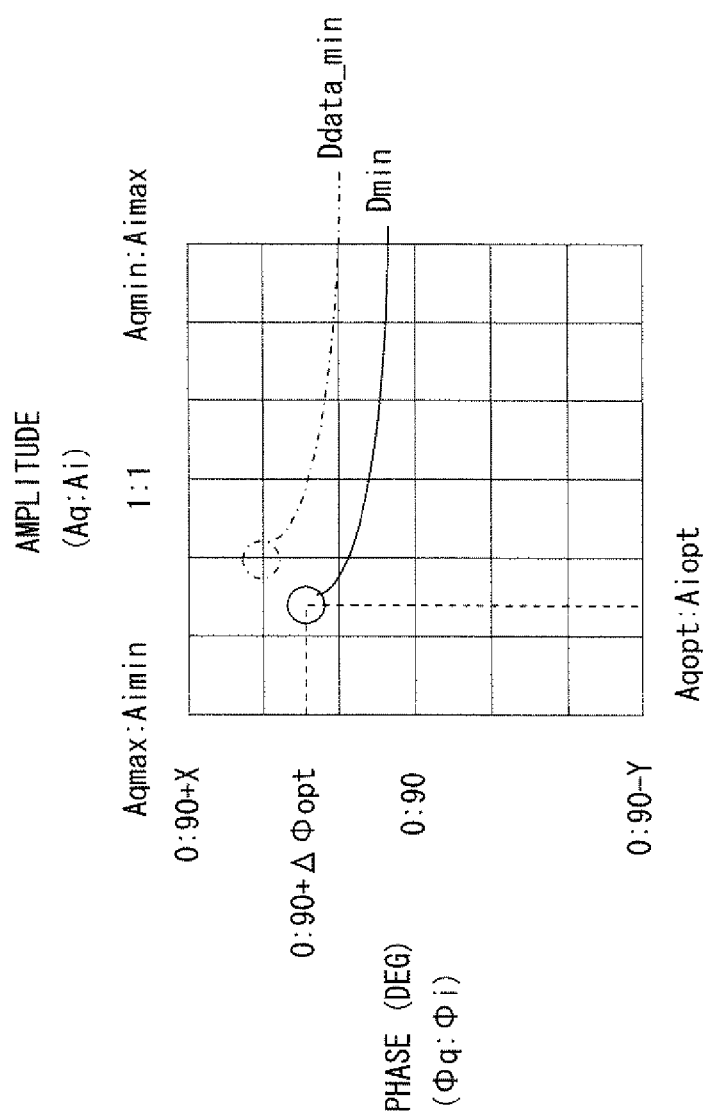
FIG. 6 is a view for explaining a method of searching the optimum amplitude and phase of an RF transmission signal by the lattice search algorithm in the amplitude-phase setting part shown in FIG. 3.

FIG. 6 is a view for explaining a method of searching the optimum amplitude and phase of an RF transmission signal by the lattice search algorithm in the amplitude-phase setting part 40B shown in FIG. 3.

In FIG. 6, the abscissa axis denotes an amplitude of an RF transmission signal as a ratio of an amplitude Aq of a Q signal to an amplitude Ai of an I signal, and the ordinate axis denotes a phase of an RF transmission signal as a ratio of a phase $\phi q$ of a Q signal to a phase $\phi i$ of an I signal.

For example, it is assumed that a preparation scan is performed while changing the ratio of the amplitude Aq of the Q signal to the amplitude Ai of the I signal at a regular interval in the Aqmax:Aimin to Aqmin:Aimax range by controlling the amplitude Ai of the I signal while the phase $\phi i$ of the I signal is changed from 90-degrees in the +X to −Y range at a regular interval while keeping the phase $\phi q$ of the Q signal at 0 degree. Note that it is reported that 4:1 is a limit in Aqmax:Aimin and 1:4 is a limit in Aqmin:Aimax, respectively. Then, a deviation Ddata(Aq/Ai, $\phi i$) in signal intensity according to the amplitude ratio Aq/Ai between the Q signal and the I signal and the phase $\phi i$ of the I signal is obtained on the respective lattice points in the two-dimensional space as shown in FIG. 6. In the case of multi-slice imaging, lattice points of the number equal to the number of slices exist.

Here, the minimum deviation Ddata_min among the deviations Ddata on the lattice points is searched. Next, the points surrounding the lattice point with the minimum deviation Ddata_min are extracted. Then, it can be regarded that the point showing the minimum deviation Dmin in signal intensity exists in the range surrounded in the surrounding points of the lattice point with the minimum deviation Ddata_min. Accordingly, the minimum deviation Dmin and the corresponding point, i.e., the amplitude ratio Aqopt/Aiopt between the Q signal and the I signal and the phase $\phi i = 90 + \Delta \phi opt$ of the I signal, can be estimated by an interpolating processing using the respective deviations Ddata on the surrounding points of the lattice point with the minimum deviation Ddata_min. The interpolation processing may be an arbitrary one such as a linear interpolation, a spline interpolation or a second order interpolation, and a user can also select one from these interpolation methods described above. For example, a three-dimensional spline interpolation is practical.

Note that in the minimum deviation Dmin, the amplitude ratio Aqopt/Aiopt between the corresponding Q signal and I signal and the phase $\phi i = 90 + \Delta \phi opt$ of the I signal can be also obtained by fitting with an arbitrary-order-function using the deviations Ddata on all the lattice points. However, as described above, fitting using only the surrounding points of the lattice point with the minimum deviation Ddata_min in a narrow range can make a closer approximation to improve calculation accuracy.

On the other hand, the bisection method is a method to search such an amplitude and a phase of RF transmission signal that a deviation D becomes minimum by repeating determination of which of deviations D1 and D2 in signal intensities, between ROIs or in an ROI, of two pieces of image data acquired while changing either an amplitude or a phase of RF transmission signal is smaller and acquisition of two pieces of image data while changing either the amplitude or the phase of the RF transmission signal into values near a value corresponding to the smaller deviation again. Consequently, in the case of using the bisection method, a preparation scan for acquiring image data while changing either a phase or an amplitude of RF transmission signal and the processing to determine which of the deviations D1 and D2 in signal intensities between ROIs of two pieces of image data is smaller are performed repeatedly.

Figure 7:
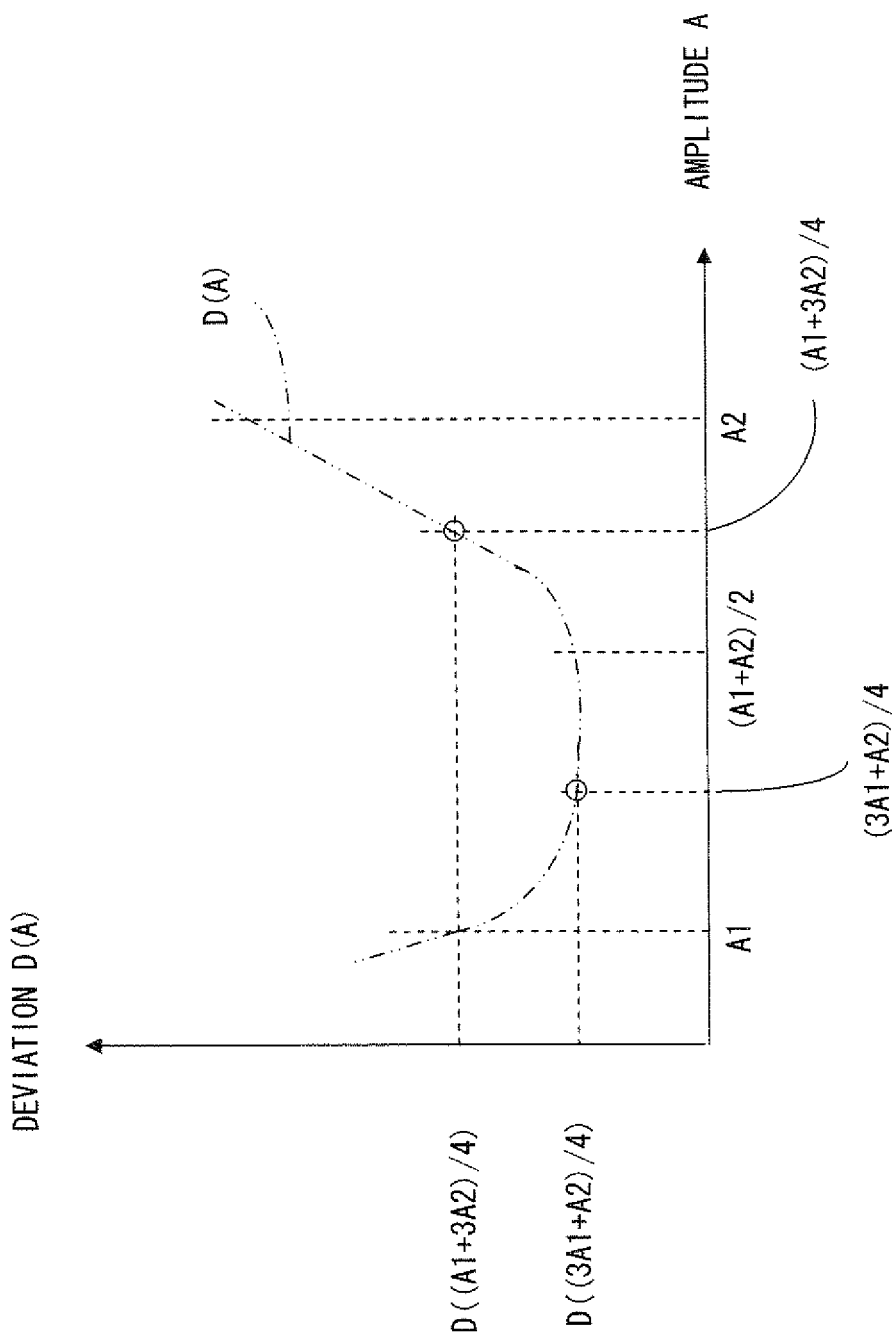
FIG. 7 is a graph for explaining a method of searching the optimum amplitude and phase of an RF transmission signal by the bisection method in the amplitude-phase setting part shown in FIG. 3.

FIG. 7 is a graph for explaining a method of searching the optimum amplitude and phase of an RF transmission signal by the bisection method in the amplitude-phase setting part 40B shown in FIG. 3.

In FIG. 7, the abscissa axis denotes an amplitude A of an I signal in an RF transmission signal and the ordinate axis denotes a deviation D(A) in signal intensity corresponding to the amplitude A of the I signal between ROIs. For example, when the amplitude A of RF transmission signal is changed, two amplitudes away enough to be thought that the amplitude Aopt corresponding to the minimum deviation Dmin exists between them are determined as base points A1 and A2. Subsequently, the amplitude equivalent to the midpoint (A1+A2)/2 of the two amplitudes A1 and A2 is calculated. Next, respective midpoints (3A1+A2)/4 and (A1+3A2)/4 between the midpoint (A1+A2)/2 and each of the two base points A1 and A2 adjacent to the midpoint (A1+A2)/2 are calculated.

Then, with setting the amplitude of an RF transmission signal into two amplitudes equivalent to the two points (3A1+A2)/4 and (A1+3A2)/4 in both sides of the midpoint (A1+A2)/2 by a preparation scan, image data is acquired. Next, respective deviations D((3A1+A2)/4) and D((A1+3A2)/4) in signal intensities of pieces of image data corresponding to the two points (3A1+A2)/4 and (A1+3A2)/4, respectively, are calculated. Next, the deviation D((3A1+A2)/4) is compared with the deviation D((A1+3A2)/4) to specify which deviation D(A) is smaller. Then, it can be thought that the amplitude Aopt corresponding to the minimum deviation Dmin exists in the smaller deviation D(A) side of the midpoint (A1+A2)/2 of the two base points A1 and A2.

For that reason, acquisition of pieces of image data corresponding to two different amplitudes and comparison determination processing described above are performed while setting the two points A1 or A2 and (A1+A2)/2 of both sides, between which the point (3A1+A2)/4 or (A1+3A2)/4 corresponding to the value of the smaller deviation D(A) is a midpoint, as new basic points. The minimum deviation Dmin and the corresponding amplitude Aopt can be obtained by repeating the image data acquisition and the comparison determination processing mentioned above.

Note that, when the search for the amplitude progresses to a certain extent, it is preferable that the search for the phase is performed by a similar method. The phase φopt and the amplitude Aopt of RF transmission signal to minimize the deviation D can be obtained by repeating the searches for the amplitude and the phase mutually while reflecting the search results. For example, in this case, it leads to reduction of an imaging period to prepare plural sets, each consisting of a sequence for multi-slice imaging that transmits RF transmission signals having mutually different amplitudes to acquire two pieces of slice image data and a sequence for multi-slice imaging that transmits RF transmission signals having mutually different phases to acquire two pieces of slice image data, perform calculation and comparison determination processing of the deviation D in intervals between multi-slice imagings and reflect the processing result on the subsequent multi-slice imaging. It is thought that the minimum deviation Dmin and the corresponding amplitude Aopt and phase φopt can be obtained with a practicable accuracy when the multi-slice imaging is repeated approximately four times respectively for the amplitude and the phase.

Next, the method that obtains the amplitude and the phase of an RF transmission signal so as to form more homogeneous B1 distribution and sets the obtained amplitude and phase as an imaging condition will be described.

In this case, a B1 distribution (RF magnetic field distribution) is acquired in advance by a preparation scan while respectively changing the phase and the amplitude of RF transmission signal. The B1 distribution can be acquired before installation of the apparatus or before each imaging scan by a known method. For example, a B1 distribution component can be extracted by removing components due to influences other than the B1 distribution with a calculation between respective signals acquired by applying a 30-degree RF nutation pulse and a 60-degree RF nutation pulse. When the B1 distribution is obtained, the object P may be a phantom. However, it is preferable that the object P is a human body in view of accuracy. The B1 distribution varies depending on a body shape including a weight and a height of an object P, RF coils 24 used for transmitting an RF transmission signal and an imaging region. For that reason, it is preferable in view of accuracy to obtain B1 distributions for respective body shapes of objects P, respective RF coils 24 to be used and respective imaging regions.

The B1 distribution obtained as mentioned above has a characteristic similar to that of a signal intensity distribution. Then, the optimum phase φopt and amplitude Aopt of RF transmission signal can be obtained based on the B1 distribution. That is, the amplitude and the phase of the RF transmission signal to obtain more homogeneous B1 distribution corresponding to an imaging condition including a body shape of an object P can be set as an imaging condition.

Thus far, the method to obtain the phase φopt and the amplitude Aopt of RF transmission signal by which the deviation in signal intensity becomes minimum based on data acquired by a preparation scan and the method to obtain the phase φopt and the amplitude Aopt of RF transmission signal so as to obtain the most homogeneous B1 distribution are described. However, the optimum phases φopt and amplitudes Aopt of RF transmission signal, which reduce an influence of B1 inhomogeneity previously obtained corresponding to respective imaging conditions such as characteristics of objects P, imaging parts and/or characteristics of RF coils 24, may be stored in the computer 32 to form a database so that an appropriate phase φopt and an appropriate amplitude Aopt of the RF transmission signal can be selected and used according to an imaging condition.

For that purpose, the optimum phases φopt and amplitudes Aopt of the RF transmission signal according to imaging conditions such as characteristics of objects P, imaging parts and/or characteristics of RF coils 24 are stored in the data amplitude-phase balance database 46 in the computer 32. The characteristics of an object P include a body shape such as a weight and a height of the object P, a volume, a distribution of water, a distribution of fat, a distribution of muscle, a body frame and an age. The characteristics of an RF coil 24 include the number of surface coils used for transmission of an RF signal, a size, a shape and a type.

The phase φopt and the amplitude Aopt of RF transmission signal for each imaging condition obtained in the amplitude-phase setting unit 40B by the method described above while performing a preparation scan in the past can be written and stored in the data amplitude-phase balance database 46. In this case, an appropriate phase φopt and an appropriate amplitude Aopt of RF transmission signal vary in different values for each apparatus. Alternatively, without the above-described method with a preparation scan, an appropriate phase φopt and amplitude Aopt of the RF transmission signal for each imaging condition estimated or obtained in advance by another method can be also stored in the data amplitude-phase balance database 46 before installation of the apparatus. In this case, the phase φopt and the amplitude Aopt of RF transmission signal can be also set to values according to a type of the magnetic resonance imaging apparatus 20. However, an appropriate phase φopt and an appropriate amplitude Aopt of the RF transmission signal may be also obtained at every imaging and stored in the data amplitude-phase balance database 46 from the perspective of accuracy improvement.

The amplitude-phase setting unit 40B is configured to refer to the data amplitude-phase balance database 46, read the phase φopt and the amplitude Aopt of RF transmission signal corresponding to an imaging condition such as a characteristic of an object P, an imaging part and a characteristic of the RF coil 24 input from the input device 33 from the data amplitude-phase balance database 46 and set the read phase φopt and amplitude Aopt as an imaging condition for an imaging scan.

Note that, instead of the phase φopt and the amplitude Aopt of RF transmission signal, a function or a table representing B1 distributions corresponding to respective imaging conditions may be stored in the data amplitude-phase balance database 46 and the amplitude-phase setting unit 40B may be configured to set the optimum phase φopt and amplitude Aopt of RF transmission signal based on the B1 distribution corresponding to the imaging condition.

Then, other functions of the computer 32 will be described.

The sequence controller control unit 41 has a function for controlling the driving of the sequence controller 31 by giving an imaging condition including a pulse sequence, acquired from the imaging condition setting unit 40, to the sequence controller 31 based on information from the input device 33 or another element. In addition, the sequence controller control unit 41 has a function to receive raw data from the sequence controller 31 and arrange the raw data in k-space formed in the k-space database 42. Therefore, the k-space database 42 stores the raw data generated by the receiver 30 as k-space data.

The image reconstruction unit 43 has a function for reconstructing image data of the object P by capturing the k-space data from the k-space database 42 and performing image reconstruction processing including FT (Fourier Transformation) of the k-space data, and writing the generated image data to the image database 44. Therefore, the image database 44 stores the image data reconstructed in the image reconstruction unit 43.

The image processing unit 45 has a function for generating two-dimensional image data for displaying by performing necessary image processing to image data read from the image database 44 and displaying the generated image data on the display unit 34.

(Operation and Action)

Next, the operation and action of a magnetic resonance imaging apparatus 20 will be described.

Here, a case of setting plural ROIs and determining an amplitude and a phase of the RF transmission signal so that a deviation in signal intensity between the ROIs becomes minimum will be described. Also in a case where an amplitude and a phase of the RF transmission signal are determined so that a deviation in signal intensity in a single ROI becomes minimum or a homogeneous B1 distribution is obtained, imaging can be performed by a similar flow.

Figure 8:
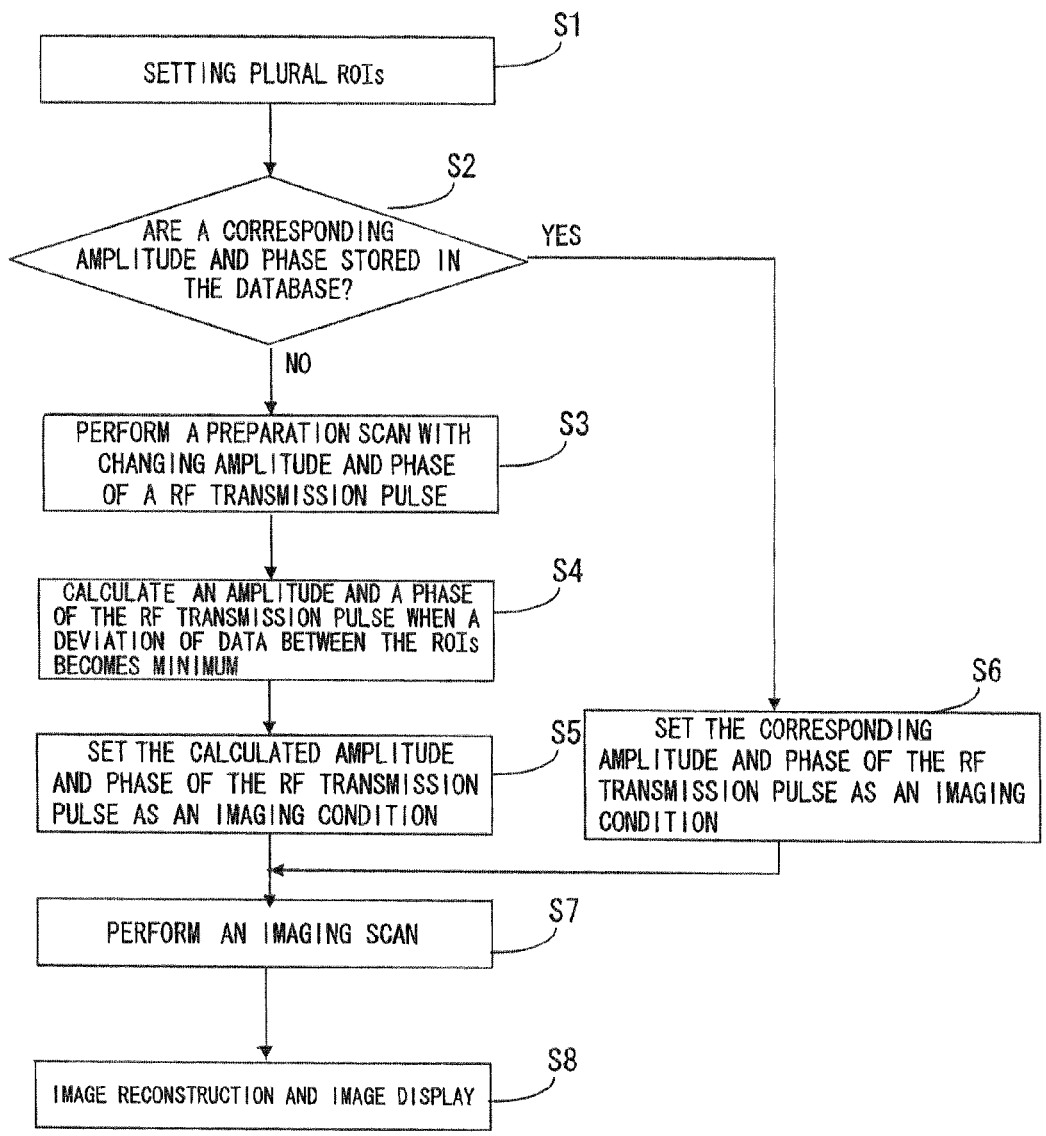
FIG. 8 is a flowchart showing a procedure for acquiring image data of an object with B1 shimming by adjusting a phase and an amplitude of an RF transmission signal in the magnetic resonance imaging apparatus shown in FIG. 1.

FIG. 8 is a flowchart showing a procedure for acquiring image data of an object P with B1 shimming by adjusting a phase and an amplitude of an RF transmission signal in the magnetic resonance imaging apparatus 20 shown in FIG. 1. The symbols each including S with a number in FIG. 8 indicate respective steps of the flowchart.

First, in step S1, plural ROIs are created manually or automatically in the ROI setting unit 40A in the computer 32. In the case of creating the ROIs automatically, a preparation scan is performed and image data is obtained by a signal processing and an image reconstruction processing described below. Then, a region for setting the ROIs is extracted with a threshold processing of signal intensities of the image data.

Next, in step S2, the data amplitude-phase balance database 46 is referred to by the amplitude-phase setting unit 40B and it is determined whether or not an appropriate phase and an appropriate amplitude of RF transmission signal corresponding to the imaging condition such as a characteristic of the object P and the ROIs are stored in the data amplitude-phase balance database 46.

When an appropriate phase and an appropriate amplitude of the RF transmission signal are not stored in the data amplitude-phase balance database 46, a preparation scan while changing an amplitude and a phase of the RF transmission signal is performed in step S3. Note that, when an instruction to calculate an appropriate phase and an appropriate amplitude of RF transmission signal with a preparation scan is input to the amplitude-phase setting unit 40B from the input device 33, the preparation scan is performed in step S3 even where an appropriate phase and an appropriate amplitude of RF transmission signal are stored in the data amplitude-phase balance database 46.

For that purpose, an imaging condition for the preparation scan while changing an amplitude and a phase of an RF transmission signal is set by the imaging condition setting unit 40. Then, data acquisition is performed according to the set imaging conditions.

That is, the object P is set to the bed 37 in advance, and a static magnetic field is generated at an imaging area of the magnet 21 (a superconducting magnet) for static magnetic field excited by the static-magnetic-field power supply 26. Further, the shim-coil power supply 28 supplies current to the shim coil 22, thereby uniformizing the static magnetic field generated at the imaging area.

Then, the input device 33 sends instruction for starting the preparation scan to the sequence controller control unit 41. The sequence controller control unit 41 supplies the imaging condition while changing an amplitude and a phase of an RF transmission signal received from the imaging condition setting unit 40 to the sequence controller 31. Therefore, the sequence controller 31 drives the gradient power supply 27, the transmitter 29, and the receiver 30 in accordance with the imaging condition received from the sequence controller control unit 41, thereby generating a gradient magnetic field at the imaging area having the set object P, and further generating RF signals from the RF coil 24.

Specifically, an RF signal generated in the signal generator 31C in the sequence controller 31 is output to the 90-degree signal distributor 29A in the transmitter 29 and distributed to an I signal and a Q signal in the 90-degree signal distributor 29A. An amplitude and a phase of the I signal are adjusted in the amplitude-phase balancer 29B according to the control signals from the amplitude control unit 31A and the phase control unit 31B. Then, the I signal and the Q signal are output to the corresponding coil elements 24A and 24B from the I signal transmission/reception channel 38B and the Q signal transmission/reception channel 38C through the transmission pre-amplifiers 29C, the power amplifiers 29D, the isolators 29E and the transmission/reception selector switches 38A, respectively. Consequently, an RF transmission signal with an adjusted amplitude and phase are transmitted toward the object P from the coil elements 24A and 24B.

Consequently, the coil elements 24A and 248 of the RF coil 24 receive NMR signals generated due to nuclear magnetic resonance in the object P. Then, the receiver 30 receives the NMR signals from the RF coil 24 via the transmission/reception selector switch 38A, the 90-degree phase compositor 38D and the reception pre-amplifier 38F, and generates raw data that is digital data of NMR signals by A/D conversion subsequent to necessary signal processing. The receiver 30 supplies the generated raw data to the sequence controller 31. The sequence controller 31 supplies the raw data to the sequence controller control unit 41. The sequence controller control unit 41 arranges the raw data as k-space data to the k-space formed in the k-space database 42.

Subsequently, the image reconstruction unit 44 reads the k-space data from the k-space database 42 and reconstructs image data. The generated image data is written in the image database 44. Consequently, pieces of image data corresponding to the mutually different amplitudes and phases of the RF transmission signal with regard to each of the ROIs are stored in the image database 44.

Next, in step S4, the amplitude-phase setting unit 40B in the computer 32 obtains a deviation in representative value of signal intensities between the ROIs as an index indicating a variation in signal intensity of the image data between the ROIs according to a predetermined definition. Then, such an amplitude and a phase of RF transmission signal that the deviation of the plural pieces of image data corresponding to mutually different amplitudes and phases of RF transmission signal becomes minimum are calculated by an arbitrary search method based on the deviation.

Next, in step S5, the amplitude-phase setting unit 40B sets the calculated amplitude and phase of RF transmission signal as an imaging condition for an imaging scan.

On the other hand, when it is determined that the appropriate phase and amplitude of an RF transmission signal corresponding to the imaging condition such as the characteristic of the object P and the ROIs are stored in the data amplitude-phase balance database 46 in step S2, the amplitude-phase setting unit 40B sets the corresponding appropriate phase and amplitude of RF transmission signal as the imaging condition for the imaging scan in step S6.

Subsequently, in step S7, an imaging scan is performed with the phase and amplitude of the RF transmission signal set as the imaging condition. The flow of the imaging scan is similar to that of the preparation scan.

Next, in step S8, an image reconstruction processing is performed. Consequently, the image data, acquired by the imaging scan, on which an influence of B1 inhomogeneity is reduced by B1 shimming with appropriate adjustment of the phase and amplitude of RF transmission signal, is stored in the image database 44. Then, the image processing unit 45 reads the image data from the image database 44 and performs necessary image processing, thereby generating two-dimensional image data for display. The generated two-dimensional image data is displayed on the display unit 34.

That is, the magnetic resonance imaging apparatus 20 mentioned above is an apparatus to change an amplitude and/or a phase of an RF transmission signal transmitted from the RF coil 24 for reducing an influence of B1 inhomogeneity. Especially, it is possible to set a desired single ROI or desired plural ROIs in the magnetic resonance imaging apparatus 20. Then, for example, an amplitude and/or a phase of an RF transmission signal are determined so that a variation in signal intensity of data in an ROI and/or between the ROIs is reduced. Alternatively, an amplitude and/or a phase of an RF transmission signal are determined so that a more homogeneous B1 distribution is obtained.

(Effect)

Consequently, according to the magnetic resonance imaging apparatus 20, flexibility for setting a region to be a correction target of a variation in signal intensity can be improved and operability regarding a B1 shimming target region can be improved. In addition, the optimum amplitude and phase of RF transmission signal adaptively to an imaging condition such as a characteristic of an object P are obtained easily and B1 shimming can be performed. Consequently, it is possible to transmit NMR signals to the data processing system from the RF coil 24 without deteriorating the NMR signals and, therefore, the B1 shimming function can be implemented in the apparatus.

(Modification)

Note that, in the embodiment described above, a deviation in signal intensity of pieces of image data corresponding to respective ROIs is used as an indicator of variation. However, a deviation in signal intensity of pieces of k-space data corresponding to respective ROIs also may be used as an indicator of variation.

What is claimed is:

1. A magnetic resonance imaging apparatus comprising:
an RF coil configured to transmit a radio frequency signal to an object and to receive an MR signal from the object;
a storage unit configured to store at least one of an amplitude and phase of the radio frequency signal respectively corresponding to each of plural imaging conditions which include at least one of (a) a characteristic of the object and (b) a characteristic of the RF coil;
an input device configured to input an imaging condition; and
an imaging unit configured to read from the storage unit at least one of the amplitude and phase of the radio frequency signal corresponding to the inputted imaging condition, and to perform an imaging scan to acquire image data by using the at least one of the amplitude and the phase read from the storage unit.

2. The apparatus of claim 1, wherein:
the storage unit stores the at least one of an amplitude and phase of the radio frequency signal corresponding to respective imaging regions of the object in addition to the imaging conditions, and
the imaging unit performs the imaging scan by using the at least one of the amplitude and the phase corresponding to an inputted imaging region of the object in addition to the inputted imaging condition.

3. The apparatus of claim 1, wherein:
the at least one characteristic of the object includes at least one of a weight, a height, a volume, a distribution of water, a distribution of fat, a distribution of muscle, a body frame and an age.

4. The apparatus of claim 1, wherein:
the at least one characteristic of the RF coil includes at least one of: the number of coils used for transmitting, a size, a shape and a type of the RF coil.

5. The apparatus of claim 1, further comprising:
a switch configured to switch the radio frequency signal to the RF coil for a transmitting mode and to switch the received MR signal from the RF coil to a receiver for a receiving mode.

6. A magnetic resonance imaging (MRI) method comprising:
predetermining and pre-storing at least one of an amplitude and phase of an MRI radio frequency (RF) nutation signal respectively corresponding to a plurality of pre-determined imaging conditions which include at least one of (a) a characteristic of a generalized patient to be imaged and (b) a characteristic of an RF coil used to acquire MRI signals from a generalized patient to be imaged;
thereafter placing a particular patient to be imaged in an MRI system gantry;

inputting an imaging condition for said patient; and reading from storage at least one of the amplitude and phase of the RF signal corresponding to the inputted imaging condition, and performing an imaging scan to acquire MRI data using the at least one of the amplitude and the phase read from storage.

7. The method of claim 6, further comprising:

pre-storing at least one of an amplitude and phase of an RF signal corresponding to respective generalized imaging regions of the generalized patient, and performing the imaging scan using the at least one of the amplitude and the phase corresponding to an inputted imaging region of the object in addition to the inputted imaging condition.

8. The method of claim 6, wherein:

the at least one characteristic of the object includes at least one of a weight, a height, a volume, a distribution of water, a distribution of fat, a distribution of muscle, a body frame and an age.

9. The method of claim 6, wherein:

the at least one characteristic of the RF coil includes at least one of: a number of RF coils used for transmitting, a size, a shape and a type of RF coil to be used.

10. The method of claim 6, further comprising:

switching the radio frequency signal to the RF coil for a transmitting mode and switching the received MR signal from the RF coil to a receiver for a receiving mode.

\* \* \* \* \*